(12) United States Patent
Sun et al.

(10) Patent No.: US 9,099,582 B2
(45) Date of Patent: Aug. 4, 2015

(54) SILICON TEXTURING FORMULATIONS

(71) Applicant: Intermolecular, Inc., San Jose, CA (US)

(72) Inventors: Zhi-Wen Sun, Sunnyvale, CA (US); Nikhil Kalyankar, Mountain View, CA (US); Nitin Kumar, Fremont, CA (US); Minh Anh Nguyen, San Jose, CA (US); Sagar Vijay, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/261,739

(22) Filed: Apr. 25, 2014

(65) Prior Publication Data

US 2014/0231704 A1 Aug. 21, 2014

Related U.S. Application Data

(63) Continuation of application No. 13/100,692, filed on May 4, 2011, now Pat. No. 8,759,231, which is a continuation of application No. PCT/US2010/062240, filed on Dec. 28, 2010.

(60) Provisional application No. 61/290,858, filed on Dec. 29, 2009, provisional application No. 61/332,649, filed on May 7, 2010.

(51) Int. Cl.
   *C09K 13/02* (2006.01)
   *H01L 31/0236* (2006.01)
   *C23F 1/16* (2006.01)

(52) U.S. Cl.
   CPC .......... *H01L 31/02366* (2013.01); *C23F 1/16* (2013.01); *H01L 31/0236* (2013.01); *H01L 31/02363* (2013.01); *Y02E 10/50* (2013.01)

(58) Field of Classification Search
   CPC ............... C23F 1/00; C23F 1/14; C23F 1/32; C23F 1/42; C23F 1/44; C23F 1/16
   USPC ............... 252/79.1, 79.2, 79.3, 79.4, 79.5; 216/89, 90, 103, 104
   See application file for complete search history.

(56) References Cited

U.S. PATENT DOCUMENTS

| | | | |
|---|---|---|---|
| 3,980,537 A * | 9/1976 | McMinn et al. | 205/364 |
| 4,327,027 A * | 4/1982 | Howard et al. | 568/755 |
| 5,118,435 A * | 6/1992 | Nieh | 252/70 |
| 5,714,453 A * | 2/1998 | Neumiller | 510/405 |
| 7,084,187 B2 * | 8/2006 | Takase et al. | 522/153 |
| 8,540,891 B2 * | 9/2013 | Kubelbeck et al. | 216/92 |
| 2008/0085384 A1 * | 4/2008 | Ylitalo et al. | 428/32.25 |
| 2009/0195761 A1 * | 8/2009 | De Graaf et al. | 355/30 |

* cited by examiner

*Primary Examiner* — Lan Vinh

(57) ABSTRACT

The present disclosure includes a texture formulation that includes an aliphatic diol, an alkaline compound and water which provides a consistent textured region across a silicon surface suitable for solar cell applications. The current invention describes silicon texturing formulations that include at least one high boiling point additive. The high boiling point additive may be a derivative compound of propylene glycol or a derivative compound of ethylene glycol. Processes for texturing a crystalline silicon substrate using these formulations are also described. Additionally, a combinatorial method of optimizing the textured surface of a crystalline silicon substrate is described.

20 Claims, 7 Drawing Sheets

1 M KOH + 2-10% DEG
+ 1.4-2.0% DPGMEA
10 minutes
90°C

SILICON TEXTURING FORMULATIONS

CROSS REFERENCE TO RELATED APPLICATIONS

This is a Continuation application of U.S. patent application Ser. No. 13/100,692, filed on May 4, 2011, which claims priority under 35 USC §119 to PCT Application Number PCT/US10/62240 entitled "Silicon Texturing Formulations with High Boiling Point Additives and Methods of Using the Formulations", filed Dec. 28, 2010, which claimed priority under 35 USC §119 to U.S. Provisional Application Ser. No. 61/290,858, filed Dec. 29, 2009 and U.S. Provisional Application Ser. No. 61/332,649 filed May 7, 2010, each of which is herein incorporated by reference for all purposes.

FIELD OF THE INVENTION

The present invention relates generally to the processing of silicon substrates. More specifically, a process and texture solution for texturing a crystalline silicon substrate for use in a silicon based solar cell is described.

BACKGROUND OF THE INVENTION

Silicon based solar cells typically include textured crystalline silicon. A textured crystalline surface may refer to tetragonal pyramids with random pyramid base size in the few micronmeter range, where the most desirable size for the pyramid base is 1-5 micronmeters (um). The crystalline silicon surface may become textured through application of a texture formulation. A texture formulation may include a mixture of an alkaline chemical, potassium hydroxide (KOH) and isopropyl alcohol (IPA). However, this texture formulation has limitations that prevent the uniform texture formation for efficient solar cells. For example, conventional texture formulations can produce flat, untextured regions or poorly textured regions on the textured surface of the crystalline silicon substrate. Additionally, it is difficult for the conventional texture formulations to control the sizes of the pyramids formed on the surface of the silicon substrate. This is disadvantageous to the operation of a solar cell as light trapping efficiency of the solar cell is not optimal when the pyramid texture is formed of many different sized pyramids and when there are flat untextured regions on the surface of the crystalline silicon substrate.

The use of IPA in the texture formulation provides a narrow process window as IPA has a relatively low boiling point of 82.4° C. A conventional texture formulation which includes KOH and IPA is typically used at a temperature of approximately 80° C. and thus may have a limited texture etch rate due to the low bath temperature that is limited by the low boiling point of IPA. Texture formulations with IPA have a composition which changes with time and may not provide consistent texturing. Furthermore, IPA has a low flashing point of 12° C. which makes IPA a fire hazard. Consequently, an improved texture formulation which provides a consistent textured region across a silicon surface which is not subject to the drawbacks associated with textured formulations which include IPA is desired.

BRIEF DESCRIPTION OF THE DRAWINGS

Various embodiments of the invention are disclosed in the following detailed description and the accompanying drawings.

DETAILED DESCRIPTION

Figure 1:
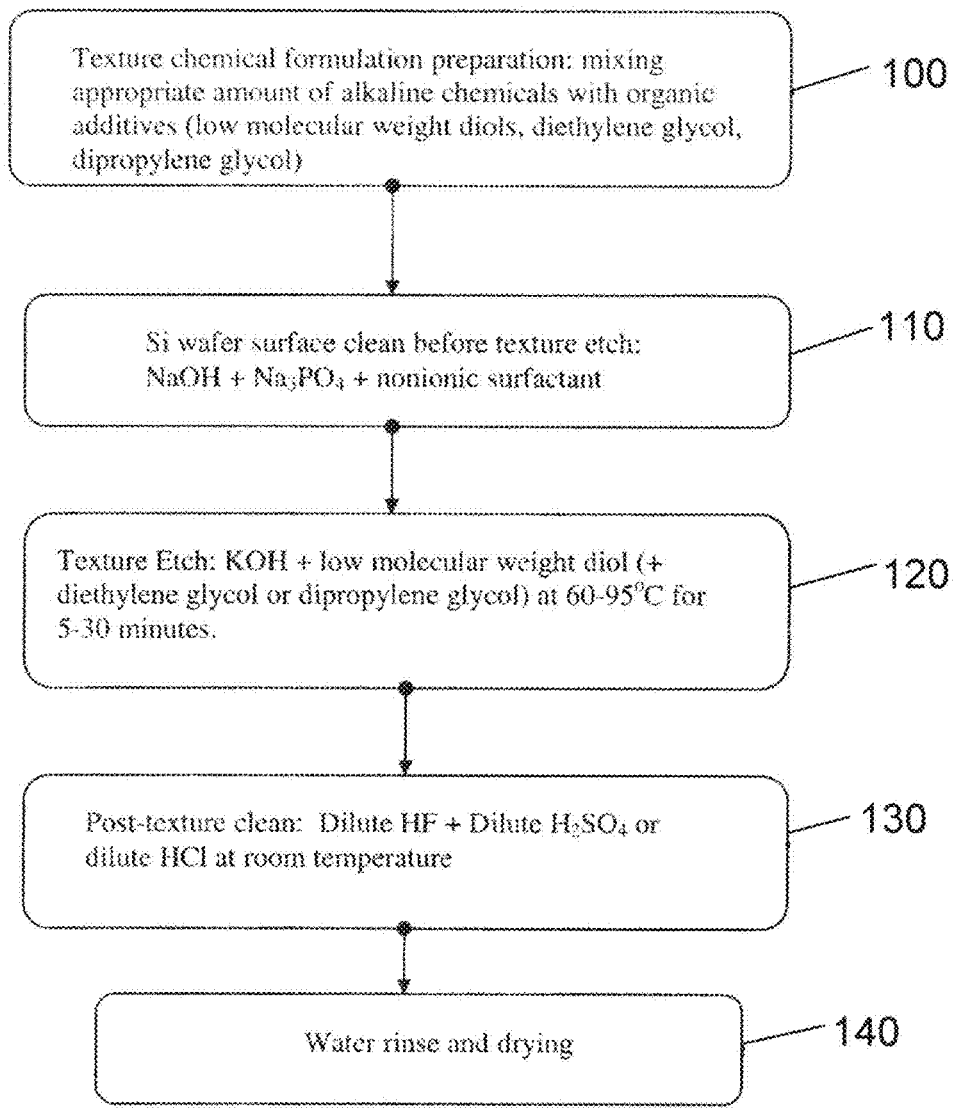
FIG. 1 is a flowchart describing a process for texturing a crystalline silicon substrate.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present disclosure describes a texture formulation that includes a non-cyclic diol. A non-cyclic diol is also known as an aliphatic diol. Diols may be separated into two types, namely cyclic diols and non-cyclic diols. Non-cyclic or aliphatic diols have been found to provide improved functionality in a texture formulation. A diol, also known as a glycol, may refer to a chemical compound containing two hydroxyl groups. Diols have a high boiling point to allow faster texture etch and therefore higher throughput at high temperature. Additionally, the solubility of aliphatic diols in alkaline solution allows easy concentration monitoring and control in production. Furthermore, aliphatic diols have higher flashing point than IPA, they are easily biodegradable and do not constitute environmental hazards which are critical for high volume manufacturing. Processes for texturing a substrate using these formulations are also described. While the texturing process may be implemented for silicon, it is also contemplated that germanium and other types of substrates may be textured by the texture formulation and texturing processes as described in the present disclosure.

In an embodiment, the texture formulation may be formed of at least one aliphatic diol, an alkaline compound, and water. The texture solution may include any number of aliphatic diols, but may include between one and three, and more particularly between one and two high boiling point additives. The choice of the number of aliphatic diols may be selected such that the texture etch performance can be easily obtained, and at the same time, the chemical concentration monitoring and control can also be realized without excess difficulty. It is contemplated that aliphatic diols with a carbon atom number in the molecular formula of the diols between 4 and 10 may be effective in a silicon texture formulation. The silicon texturing solution may include the aliphatic diols in the volume ratio of 0.2 to 10.0% of the total solution volume, or 2-100 grams per liter (g/L) weight concentration. Without being bound by theory, it is postulated that the aliphatic diols can adsorb on the silicon wafer surface and act as randomly-located etch masks during the pyramid initiation and propagation. The adsorption of the aliphatic diols also greatly lowers surface tension. This may improve uniform texture formation with controllable pyramid sizes. Further, the high boiling points of the aliphatic diols enable the texture etch at high temperature for faster texture etch, and low chemical consumption due to low evaporation loss. Exemplary aliphatic diols may include un-substituted butanediol, pentanediol, hexanediol, heptanediol, and octanediol Alternatively, the aliphatic diols may be the substituted compounds of the above un-substituted compounds with various functional groups such that the total number of carbon atoms in the molecule is greater than 4 but less than or equal to 10. Examples of the substituted diols include, but are not limited to, 3-methyl-1,5-pentanediol, 2-methyl-2,4-pentanediol, 2,2,4-trimethyl-1,3-pentanediol, 1,4-butanediol-diglycidil ether, 1,4-butanediol vinyl ether, 1,4-butanediol divinyl ether, 1,4-butanediol dimethylcrylate, 2-ethyl-1,3-hexanediol, 2,5-dimethyl-2,5-hexanediol.

The alkaline compound of the texture formulation may include KOH, NaOH, TMAH, RbOH, CsOH, or $NH_3OH$ in an amount in the approximate range of 0.2 M-2M (moles per liter). In an embodiment where the alkaline compound is KOH, the KOH may have a concentration in the approximate range of 0.2 M to 1.5 M, and more particularly in the range of 0.4 M to 1.2M. The concentration selected for the alkaline compound relates to other parameters such as temperature of the texture solution and an amount of time that the texture solution is applied to the crystalline silicon substrate, as well as the amount of etched Si built-up in a bath. Size of the pyramids may be tuned by the concentration of the alkaline compound. Also, the concentration of the alkaline compound may remain below a certain limit to ensure true anisotropic etching of the crystalline silicon surface and the formation of pyramids. The crystalline silicon substrate may be, but is not limited to, an epi-type flat silicon wafer or a standard silicon wafer having saw damage layer still remaining on the wafer surface, or a silicon wafer with saw-damage removed by either mechanical or chemical means.

In the instance of a crystalline silicon wafer having saw damage, the silicon texture solution may be formulated to remove wire saw-damage in a separate dedicated step, or as an integral part of 1-step process that accomplishes both the saw damage-removal and the surface texture process within one single step. The term wire-saw damage removal refers to a process of removing the top 2-5 um Si wafer that has been mechanically damaged by the wire sawing process, the removal can be implemented mechanically or chemically. The texture formulation with aliphatic diols may remove any wafer thickness by controlling the etch time and thus may be used for saw-damage removal separately.

Another additive that may be included in the texture solution is chemically dissolved silicon. The dissolved silicon may be added to the texture solution in small amounts to nucleate pyramids and to increase a rate of texture formation. Silicon in different forms may be added into the texture solution in the approximate concentration of 1 g/L to 5 g/L. The forms of silicon include elemental Si such as Si wafers, Si powders, Si pieces; and silicon oxide containing compounds in multiple forms such as silica particles, silica gels, silica powders; and various silane-containing compounds such as TEOS (tetraethoxysilane). Any soluble form of Si and O containing compounds can be used in the texture formulation and the compounds listed above serve only as illustrative examples. Addition of silicon increases the efficiency of the texture formation and controls the pyramid size and its distribution because part of the dissolved silicon in various physical forms can serve as micro-masks for the formation of pyramids, thus the Si concentration can also control the pyramid density as well as the pyramid size. With the addition of silicon to the texture bath formulation, it has been seen that the texture of a surface of a crystalline silicon substrate can be accomplished in less than 5 minutes, the average pyramid size being less than 3 um, suitable for a silicon solar cell application.

In another embodiment, simple organic compounds that can effectively compete with the aforementioned additives to adsorb on the Si surface have been added into the bath formulation to further tune the texture etch rate and the pyramid density and pyramid size. The choice of such compounds depends on the conductivity type of the silicon wafer substrate. For p-type Si with acceptor dopants such as Boron and Ga, low molecular weight carboxylic acids with 2-8 carbon atoms can be used, such acids include, but are not limited to, acetic acid, propionic acid, lactic acid, glycolic acid, glycine, malonic acid, succinic acid, oxalic acid, tartaric acid, adipic acid, malic acid, citric acid, and aspartic acid. A concentration range for such low molecular weight organic carboxylic acid can be 0.05M to 0.5M, or more preferably 0.1M to 0.4M. For n-type Si with donor dopants such as P and As, low molecular weight organic compounds containing surface-active cations such as TMAH and choline can be used, the preferred concentration range being 0.05M to 0.5M, or more preferred in between 0.1M to 0.4M.

In yet another embodiment, additives disclosed herein can be mixed with any additives disclosed in PCT Application Number PCT/US10/62240, which is fully incorporated by reference in its entirety. As an example, a bath formulation containing an aliphatic diol such as 3-methyl-1,5-pentanediol and a derivative of ethylene glycol, diethylene glycol, can be used to texture crystalline silicon wafers with long bath lifetime, to at least 30 g/L dissolved Si. The procedure described in PCT Application Number PCT/US10/62240 for texture bath preparation and bath use in texture process can be used with the sole modification of an aliphatic diol is used here.

The concentrations and amounts for the different components of the formulations may be adjusted based on the intended use of the silicon texture formulations. Also, the concentrations and amounts may be adjusted during scale-up of the silicon texture formulations to manufacturing scale processes. Many of the examples included herein are from formulations developed for research and development. As such, the formulations may be adapted to manufacturing scale processes, either batch processes or in-line processes, according to techniques well known to those in the art.

These additives or combinations of additives may tune the silicon texture formulation to be heated to a temperature in the range of approximately 70° C. to approximately 100° C., and in one particular embodiment a temperature of approximately 90° C. For in-line texturing, the formulation may be tuned to etch in the approximate range of 80° C.-90° C. For batch texturing, the formulation may be tuned to etch in the temperature range of approximately 80° C. since the compounds from each of the families of compounds have boiling points in the range of approximately 130° C. to above 200° C. Because of these high boiling points of the additives, there is minimal evaporation loss during the texturing process when performed at elevated temperatures of 90° C. or above. With minimal evaporation, a need to replenish the additives during processing may be reduced and the lifetime of the silicon texture formulation may be extended. This may be of particular use in volume manufacturing where large volumes of the texture formulation are used in large baths. Large volume manufacturing may include either in-line or batch processing. Additionally, these additives may be advantageous for manufacturing because they are biodegradeable, minimize environment impact and because the lifetimes of the baths are extended by the addition of the additives, disposal requirements are reduced.

In one particular embodiment, the silicon texture solution may be 20 g/L-60 g/L KOH, approximately 20 g/L-30 g/L 3-methyl-1,5-pentanediol, and 0-2 g/L dissolved silicon in the fresh bath formulation. In another embodiment, this same solution may further include diethylene glycol in the approximate amount of 20 g/L-80 g/L for greater lifetime in a process that produces high levels of silica build-up during the texturing process. For example, this silicon texture solution including diethylene glycol may last at least until approximately 30 g/L of silica build-up occurs without any need for "bleed and feed" of the silicon texturing formulation. The term "bleed and feed" refers to a process where portion of the silicon texture solution is first "bled", or drained, due to excessive silica build-up and a significant slowing of the etch rate, and then a fresh silicon texture solution is "fed" to the processing tank. These exemplary silicon texture formulations may be applied to the crystalline silicon substrate at a temperature in the approximate range of 70° C.-95° C. for a time in the approximate range of 10 minutes to 30 minutes. As another example, 4-20 g/L 2-ethyl-1,3-pentanediol and 10-80 g/L diethylene glycol may be dissolved into 20-60 g/L KOH solution, with 0-2 g/L dissolved silicon, to form a stable long lifetime bath able to operate to at least 30 g/L dissolved silicon built-up. This silicon texture formulation may have an etch rate of approximately 0.6-1.0 um/minute per wafer side when maintained at an approximate temperature of 90° C., and uniform texture pattern can be generated. This formulation may also be low maintenance, requiring no replenishment of the additive or of the formulation over time. The additives used in this formulation have a low chemical cost and a low disposal cost.

FIG. 1 shows a flow chart of various embodiments of texturing a crystalline silicon substrate for use in a crystalline silicon based solar cell. In-line or batch processing may include all or some of the individual processes described in the flowchart of FIG. 1. Crystalline silicon based solar cells are much more efficient when the silicon substrate is capable of trapping light because greater conversion of that light to energy can occur. Therefore, it is highly beneficial to texture crystalline silicon substrates as part of the production of solar cells. In block 100, a texture formulation is mixed, including an aliphatic diol, an alkaline compound and water.

In one particular embodiment of the present disclosure, the texturing process may include applying a pre-cleaning solution to a crystalline silicon substrate 110. A monocrystalline silicon substrate may be in a circular wafer form, such as those used in semiconductor processing, or rectangular or square shape for solar wafers, having dimensions of up to 156 mm×156 mm. A thickness of the silicon substrate may also vary. For example, the thickness may be in the range of 80 um and 200 um for solar wafers and in the range of 275 um and 775 um for semiconductor wafers. The pre-cleaning solution may be applied to remove any contaminants from the surface of the substrate that remain after the wafer cutting process or contaminants adhering to the surface during transport and handling of the substrate. The pre-cleaning process may in particular remove heavy organic contaminants such as grease residues from human finger touch that could interfere with the subsequent texturing process. It is hypothesized that the surface organic contaminants can significantly affect the texture solution wetting of the silicon wafer surface and can thus worsen the texture uniformity on the wafer surface and prevent substrate to substrate texture repeatability. The pre-cleaning solution may be a solvent such as acetone that is suitable for removing organic contaminants or a commercial cleaning formulation. In one embodiment, the pre-cleaning solution may be acetone and a surfactant.

In an embodiment where there is a high concentration of grease-like organic contaminants, the pre-cleaning solution may be an alkaline solution containing nonionic or anionic surfactants and organic or inorganic acids. The alkaline component of these solutions may be, for example, KOH, NaOH, or TMAH. The alkaline component serves as the primary degreaser by a soaping process, the non ionic and anionic surfactants serve as additives to help remove the non-soap forming greases, the inorganic or organic acids or their salts can be added as additional additives for organic residue removal An anionic surfactant component may be an organic sulphonic acid and a non-ionic surfactant component may be alkyl benzene polyoxyethylene with 5-13 ethylene oxide units (e.g. Triton X-120) or alkyl alcohol polyoxyethylene. The surfactant component may serve as primary emulsifiers and dispersants. An organic acid component may be an organo-phosphoric acid such as 1-hydroxy-ethylidene-1,1-diphosphonic acid (HEDP). An inorganic acid component may be a phosphorous acid or a poly-phosphoric acid such as sodium tripolyphosphate ($Na_5P_3O_{10}$) or poly-carboxylic acids such as citric acids. The organic or inorganic acid components may serve as secondary emulsifiers and dispersants. Additionally, a silicate species may be added as an additional emulsifier and dispersant. In one embodiment, the pre-cleaning solution may be NaOH (20 g/L-100 g/L), $Na_3PO_4.12H_2O$ (20 g/L-40 g/L), and Triton X-120 (0.1 g/L-2.0 g/L) at 60° C.-90° C.

The pre-cleaning may be followed by a flowing ozonated water rinse or ozonated water rinse in an ultrasonic bath at heated temperature of 40-65° C., particularly in an embodiment where a surfactant is used, to remove any surfactant remaining on the cleaned surface of the crystalline silicon substrate. Ozonated water here refers to water with less than 30 ppm (part per million, or mg/L) dissolved ozone gas.

At block 120 of the flowchart of FIG. 1 the crystalline silicon substrate is textured with any embodiments of the silicon texture as previously described. In an alternate embodiment, the texturing at block 120 may include more than one texturing bath. For example, a first texturing bath may be used to remove the wire-saw damage layer by faster etch. In some instances, the crystalline silicon substrate may have surface oxidation or wire-saw damage that may require a texture solution with greater etching capabilities to initiate the texturing process. Once the wire saw-damage layer is removed to a satisfactory level (e.g. 80% damage removed) the crystalline silicon substrate may be textured by a second texturing bath with a different formulation from the first bath. The texturing solution may be formulated to tune the resulting texture formed on the surface of the saw-damage removed crystalline silicon substrate. The parameters that may be tuned to control the texture include pyramid height, surface roughness, pyramid distribution, complete texturization of the surface (whether there are any flat untextured areas), pyramid uniformity, pyramid angle, and micro-texture. Also, the texture solution may be formulated to control the whole depth of the silicon etched before the optimized texture quality has been achieved. For example, the whole depth of the silicon etched before optimized texture quality has been achieved may be in the approximate range of 3-10 um, and more preferably in the approximate range of 2-5 um. An optimized pyramid height (perpendicular from base to peak) may be in the approximate range of 2-10 um, and more particularly in the approximate range of 2-5 um. The ability to tune the depth of the silicon etched to achieve the optimized texture quality is advantageous when texturing formulations of the current invention are used to texture very thin substrates of less than 50 um thickness.

Figure 2:
FIG. 2 represents scanning electron microscope photographs of a textured surface of a monocrystalline silicon substrate.

The texture solution may be applied to the crystalline silicon substrate by immersion, spraying, dispense, or curtain dispense. The time that the texturing solution is applied to the crystalline silicon substrate may be in the approximate range of 3 minutes to 40 minutes, and more particularly in the range of 5 minutes to 15 minutes. The amount of time may be related to the temperature of the texture solution because the texturing may be faster at higher temperatures. For example, in a texture solution formed of approximately 20 g/L-60 g/L KOH, approximately 20 g/L-30 g/L 3-methyl-1,5-pentanediol and less than approximately 2 g/L dissolved silica at 80° C., texturing may be complete in approximately less than 20 minutes. For the same silicon texture solution at 90° C., the texturing may be complete in approximately less than 15 minutes. The time and temperature selected may vary depending on the formulation of the silicon texture solution and the texture profile that one is trying to achieve. Examples of the texture formed by this formulation on two different wafers are illustrated in FIG. 2 which are each a SEM (scanning electron microscope) photograph of the textured surface of a monocrystalline silicon substrate.

After texturing, a post-texturing cleaning solution may be applied to the crystalline silicon substrate at block 130 of the flowchart in FIG. 1 to remove the texture solution and any residues from the surface of the substrate, especially inorganic metallic contaminants, such as Fe, Cu, Cr, Ni, Ti, Ca, Mg, that can play the role of charge carrier lifetime killer and significantly adversely impact the energy conversion efficiency of the silicon solar cell. The post-texturing cleaning solution may be a dilute acid solution to remove any silicate gel residues and metallic contaminants from the crystalline silicon substrate surface post-texturing. A dilute acid solution may also serve to neutralize the alkaline residue left on silicon wafer surface to stop the further texturing of the substrate. The dilute acid solution may be, for example, dilute hydrofluoric (HF) acid, a dilute hydrochloric acid (HCl), or a mixture of dilute HF and dilute HCl. The dilute HF in water solution may have a limited concentration to prevent etch of the silicon. The dilute acid solution may be applied to the crystalline silicon substrate for a time sufficient to neutralize the alkaline texturing solution and to remove the inorganic contaminants.

At block 140 of the flowchart in FIG. 1 a water rinse may be applied to the crystalline silicon substrate to remove all chemicals remaining after the texturing of block 120 or the post-texture clean of block 130. The water rinse may be deionized water applied to the surface of the crystalline silicon substrate for a time sufficient to rinse away any chemicals and remaining residues. In particular, a hot water rinse at temperature of 40-65° C. may be applied. The crystalline silicon substrate may be dried to complete a texturing process sequence. The drying may be performed by a spin-dry, a dry air blower, a dry nitrogen blower, hot air dry, a marangoni dry, IPA vapor dry, or any drying methods that can be applied to the thin silicon solar wafers.

Solar cells may subsequently be formed from the textured crystalline silicon substrate. The texturing may be optimized to maximize the light trapping capabilities of the solar cells. The texturing solutions described above may be optimized to tune the textured surface to have a predetermined texture profile that can provide maximized light trapping for a given solar cell design. The optimization of the silicon texturing solution may be accomplished by a combinatorial workflow developed to screen many silicon texturing solutions having different compositions, temperatures, and application times to a crystalline silicon substrate.

It is contemplated that combinatorial processing may be employed to optimize a texturing solution to provide the optimal light-trapping texture on the surface of a crystalline silicon substrate. Combinatorial processing, in embodiments of the present disclosure, includes multiple levels of screening to select the texture solutions for further variation and optimization.

As discussed previously, the disclosure of PCT Application Number PCT/US10/62240, filed on Dec. 28, 2010, was herein incorporated by reference in its entirety. Portions of the PCT Application Number PCT/US10/62240 are inserted below to present the incorporated material in the present disclosure. Only the figure numbers and the elements identified within the figures have been changed to provide numerical consistency with the present application. No new matter has been added since the inserted material was previously incorporated by reference in its entirety.

The current invention describes silicon texturing formulations, which in one embodiment includes at least two high boiling point additives and in an alternate embodiment includes a high boiling point additive and a low molecular weight organic polymer. The high boiling point additives may be a derivative compound of propylene glycol or a derivative compound of ethylene glycol. Processes for texturing a crystalline silicon substrate using these formulations are also described. The texturing process and chemistries may be applied to either in-line or batch processing of crystalline silicon substrates. Additionally, a combinatorial method of optimizing the textured surface of a crystalline silicon substrate is described.

In one embodiment, the silicon texturing formulation may be formed of at least two high boiling point additives, an alkaline compound, and water. The silicon texturing formulation may include any number of high boiling point additives, but may include between one and four, and more particularly between two and three high boiling point additives. In an alternate embodiment the silicon texturing formulation may be formed of at least one high boiling point additive and a low molecular weight organic polymer. Another component of these formulations may be dissolved silicon.

The high boiling point additive may be one of two types of high boiling point alcohol derivatives. One type of high boiling point additive may be ether derivatives of propylene glycol, with a common chemical formula of RO—$(C_2H_4O)_n$—H where n=1-4 and R— stands for alkyl groups with 1-6 carbon atoms or RO—$(C_3H_6O)_n$—H, where n=1-4 and R— stands for alkyl groups with 1-4 carbon atoms.

One example of such a compound is diethylene glycol butyl ether (DEGBE) which has the chemical formula of $C_4H_9O(C_2H_4O)_2H$. Other examples of these compounds that have shown promising results in tuning the texturing of silicon substrates include, but are not limited to:

DEGME: Diethylene glycol methyl ether; $H(OCH_2CH_2)$ $OCH_3$

DEGDME: Diethylene glycol di-methyl ether; $CH_3$— $(OCH_2CH_2)_2OCH_3$

DEGEE: Diethylene glycol ethyl ether; $H(OCH_2CH_2)_2$ $OCH_2CH_3$

DEGPE: Diethylene glycol propyl ether; H(OCH$_2$CH$_2$)$_2$OCH$_2$CH$_2$CH$_3$

DPGME: Dipropylene glycol methyl ether; H(OCH$_2$CH$_2$CH$_2$)$_2$OCH$_3$

DPGPE: Dipropylene glycol propyl ether; H(OCH$_2$CH$_2$CH$_2$)$_2$OCH$_2$CH$_2$CH$_3$ DPGDME: Dipropylene glycol di-methyl ether; CH$_3$—(OCH$_2$CH$_2$CH$_2$)$_2$OCH$_3$]

Another type of high boiling point additive may be an ester or ether acetate derivative of ethylene glycol or propylene glycol, having the chemical formula of R1-COO—(C$_2$H$_4$O)$_n$—R2 or R1-COO—(C$_3$H$_6$O)$_n$—R2, where n=1-4 and R1 and R2 are alkyl groups with 1-5 carbon atoms. Examples of this category include, but are not limited to:

DPGMEA: dipropylene glycol methyl ether acetate having the formula CH$_3$—COO—(C$_3$H$_6$O)$_2$—CH$_3$.

PGMEA: propylene glycol monomethyl ether acetate having the formula CH$_3$—COO—(C$_3$H$_{60}$)—CH$_3$.

DEGMEA: diethylene glycol monoethyl ether acetate having the formula CH$_3$—COO—(C$_2$H$_4$O)$_2$—CH$_2$CH$_3$.

DEGEEA: Diethylene Glycol Ethyl Ether Acetate, CH$_3$COO—(C$_2$H$_4$O)$_2$—CH$_2$CH$_3$.

DEGPEA: diethylene glycol propyl ether acetate having the formula CH$_3$—COO—(C$_2$H$_4$O)$_2$—CH$_2$CH$_2$CH$_3$.

The number of carbon atoms in the high boiling point additive may influence the texturing rate of the formulation and the texture bath wetting characteristics. The texture formation rate depends on both the alkaline chemical concentration and the chemical identity and the concentration of the high boiling point alcohols. The texture formation rate and the Si etch rate are not tied together. For instance, a good texture rate can be obtained at both high etch rates and at low etch rates. In general, the etch rate may be increased by using a high boiling point additive that has fewer carbon atoms, or the etch rate may be slowed by using a high boiling point additive that has more carbon atoms.

The high boiling point additives may each be added to the formulation in the concentration range of 1.0 g/l to 100 g/l or from around 0.1%-10% by volume. Examples of these additives and their amounts include DPGMEA in an amount of approximately 1%-3% by volume, DEGEEA in an amount of approximately 3%-6% by volume, DEGEE in an amount of approximately 3%-5% by volume, or DEGBE in an amount of 0.3% to 0.6% by volume. Additionally, more than one high boiling point additive may be added to the formulation where each of the additives has a concentration within the concentration range of 1.0 g/l to 100 g/l or from around 0.1%-10% by volume.

A low molecular weight organic polymer may be added to any of the embodiments of silicon texturing formulations described above. In one particular embodiment, the low molecular weight organic polymer may be added to a silicon texturing formulation having one or more high boiling point additives. The low molecular weight organic acid may be added to increase the texture formation rate and to enhance the surface coverage of the silicon substrate by the pyramids. In one embodiment the low molecular weight organic polymer may be a polyethylene glycol (PEG), for example PEG 200-PEG 1000 (based on average molecular weight of PEG). In another embodiment the low molecular weight organic acid may be a compound such as, but not limited to, acetic acid, formic acid, propionic acid, succinic acid, glycolic acid, and glycine. Acetic acid may be a useful selection due to its availability and high solubility in water, the concentration of acetic acid may be in the approximate range of 0.2 M-0.4 M. Without being bound by theory, the low molecular weight organic acid may act as an etch rate enhancer and pyramid density modulator. In general, increasing the concentration of the low molecular weight organic acid increases the etch rate. In an embodiment, the pyramid density optimization can be obtained within a relatively narrow range of about 0.1 M-0.3 M of low molecular weight organic acids or more particularly around the concentration of about 0.2 M-0.3 M.

The alkaline compound of the silicon texturing formulations described herein may be, for example, KOH, NaOH, TMAH, RbOH, CsOH, NH$_3$OH, or choline in an amount in the approximate range of 0.3 M-2.0 M. In an embodiment where the alkaline compound is KOH, the KOH may have a concentration in the approximate range of 0.2 M to 3.0 M, and more particularly in the range of 0.4 M to 1.5 M. The concentration selected for the alkaline compound relates to other parameters such as temperature of the silicon texturing formulation and the time that the silicon texturing formulation is applied to the crystalline silicon substrate. The concentration of the alkaline compound may be selected to provide a particular texture on the crystalline silicon substrate, that texture being a surface covered with pyramid structures. The size of the pyramids may be tuned by the concentration of the alkaline compound. Also, the concentration of the alkaline compound may be low to ensure true anisotropic etching of the crystalline silicon surface and the formation of pyramids.

Another additive that may be included in any embodiment of the silicon texturing formulation is the dissolved silicon (Si). The dissolved Si can be introduced as pieces of silicon wafer or Si powder, as silica particles or powders, as sodium silicate particles or powders, or potassium silicate particles or powders. Any of these substances can be dissolved in the alkaline texture bath to form the dissolved Si. Dissolved Si may be added to the silicon texturing formulation in small amounts to help nucleate pyramid formation and to increase the rate of texture formation because some of the dissolved Si particles can serve as micro-masks for the pyramid formation. With the addition of small amount of dissolved Si to the texturing formulation, it may be possible to texture a surface of a crystalline silicon substrate in less than 5 minutes with only about 2 um Si removal. The preferred concentration for dissolved Si can be in the approximate range of 0.1 g/L to 5 g/L. Adding dissolved Si may be of particular value to a in-line silicon texturing process where the silicon texturing formulation comes from a large volume reservoir tank and is dispensed onto only a few continuously moving crystalline silicon substrates. The value of adding dissolved silica to a silicon texturing formulation used in an in-line process is because of the much slower build-up of the dissolved Si as compared to the much faster build-up of dissolved Si for the batch-mode texture process. In some cases, 10-50× slower dissolved Si build-up has been observed for in-line texturing as compared to batch-texturing.

The concentrations and amounts for the different components of the formulations may be adjusted based on the intended use of the silicon texturing formulations. Also, the concentrations and amounts may be adjusted during scale-up of the silicon texturing formulations to manufacturing scale processes. Many of the examples included herein are from formulations developed for research and development. As such, the formulations may be adapted to manufacturing scale processes, either batch processes or in-line processes, according to techniques well known to those in the art.

These additives or combinations of additives may tune the silicon texturing formulation to be heated to a temperature in the range of approximately 60° C. to approximately 100° C., and in one particular embodiment a temperature of approximately 85° C.-90° C. For in-line texturing the formulation may be tuned to etch in the approximate range of 80° C.-

95° C. For batch texturing the formulation may be tuned to etch in the temperature range of approximately 70° C.-90° C. That is because the compounds from each of the families of compounds have boiling points in the range of approximately 130° C. to above 200° C. Because of these high boiling points of the additives there is minimal evaporation loss during the texturing process when performed at elevated temperatures of 85° C. or above. With minimal evaporation occurring the need to replenish the additives during processing may be reduced and the lifetime of the silicon texturing formulation may be extended. This may be of particular use in volume manufacturing where large volumes of the texturing formulation are used in large baths. Large volume manufacturing may include either in-line or batch processing. Additionally, these high boiling point additives may be advantageous for manufacturing because they are biodegradeable, minimizing the environment impact and because the lifetimes of the baths are extended by the addition of the high boiling point additives, the volumes to be disposed of are minimized.

In one particular embodiment, the silicon texturing formulation may include two high boiling point alcohol additives (a first additive and a second additive.) The first additive and the second additive may be any combination of high boiling point alcohol additives disclosed herein, and the selection of the high boiling point additives that are combined may be based on the properties of the high boiling point additives to tune the texturing formulation for different uses. For instance, in one embodiment, the second additive may have lower molecular weight than the first additive, and in one particular embodiment, the second additive will be one of the following additives: DEG, DEGME, DPG, DPGME. In one example of a silicon texturing formulation, the first additive may be DPGMEA in an amount of approximately 1%-3% by volume, DEGEEA in amount of approximately 3%-6% by volume, DEGEE in an amount of approximately 3%-5% by volume, or DEGBE in an amount of 0.3% to 0.6% by volume. The second additive may be DEG in an amount in the approximate range of 1% to 10%. The addition of DEG may increase the overall bath stability and stabilize the etch rate. Also, the addition of DEG may increase the lifetime of the bath even when there is a significant amount of dissolved silicon in the bath. The combination of one of the first additives with DEG may allow a texturing bath to be effective even with approximately 30 g/l of dissolved silicon. The second additive may alternately be dipropylene glycol (DPG). In one embodiment the two high boiling point additives may both be derivatives of ethylene glycol such as DEGPG and DEG. In another embodiment the two high boiling point additives may both be derivatives of propylene glycol, such as DPGMEA and DPG.

In another particular embodiment, the silicon texturing formulation may be a mixture of diethylene glycol (DEG), dipropylene glycol methyl ether (DPGMEA) and KOH. DEG may have a concentration in the approximate range of 1%-10% by volume in 0.5-1.1 M KOH and DPGMEA may have a concentration in the approximate range of 1.4% to 2.0% by volume in 1.0 M KOH. This silicon texturing formulation may have an etch rate of approximately 1.0 um/min when maintained at an approximate temperature of 90° C. at 1.1M KOH concentration. Also, the uniformity of the texture provided across a monocrystalline silicon substrate by this formulation at approximately 90° C. is good and has been shown to have a standard deviation of less than 2.5%. The surface texture and uniformity is also repeatable after using the texturing formulation of this embodiment on multiple substrates. Additionally, this formulation shows very little surface residue on the monocrystalline silicon substrate after etching. This formulation has also been shown to fully remove the wire saw damage and to provide an excellent uniform texture on a monocrystalline silicon substrate within 10 minutes, and complete surface texture has been observed in only 3-5 minutes. This formulation may also be low maintenance, requiring no replenishment of the additive or of the formulation over time. The low boiling point additives used in this formulation have a low cost and a low disposal cost.

In some embodiments, the addition of the second additive is to stabilize the texture etch rate and uniformity and to prolong the bath lifetime in the presence of a high concentration of dissolved Si generated by continuous silicon etching. As the bath is being used to etch more and more silicon wafers, the accumulated build-up of dissolved silicon in the bath may gradually slow down the etch rate of the silicon substrate; and ultimately, the polymerization of the dissolved silicon species may induce the formation of silica gels that precipitate out and thus prevent uniform texture formation. With the gradual addition of the second high boiling point additive and proper KOH dosing to compensate for the KOH loss due to Si etch the Si etch rate and the texture uniformity can be maintained. According to the following generalized equation, every 1 Si atom etched will correspond to a 1-2 OH⁻ molecule loss within the texturing formulation, so a periodic KOH dose is needed to keep the OH— concentration within the desired range:

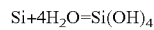

$$Si + 4H_2O = Si(OH)_4$$

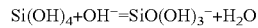

$$Si(OH)_4 + OH^- = SiO(OH)_3^- + H_2O$$

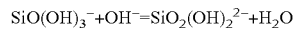

$$SiO(OH)_3^- + OH^- = SiO_2(OH)_2^{2-} + H_2O$$

The second high boiling point additive may be gradually added according to the rate of increase of dissolved Si in the bath. In general, 0.5-1 vol % of DEG can be added after every 1 g/l Si increase until reaching the full desired concentration, which can be in the range of 2-10% according to the silicon etch rate and the silicon wafer conductivity type, with higher concentration for faster etch rate of about 1 um/min./side on p-type silicon substrates, and lower concentration for slower etch rate on n-type silicon substrates.

Figure 3:
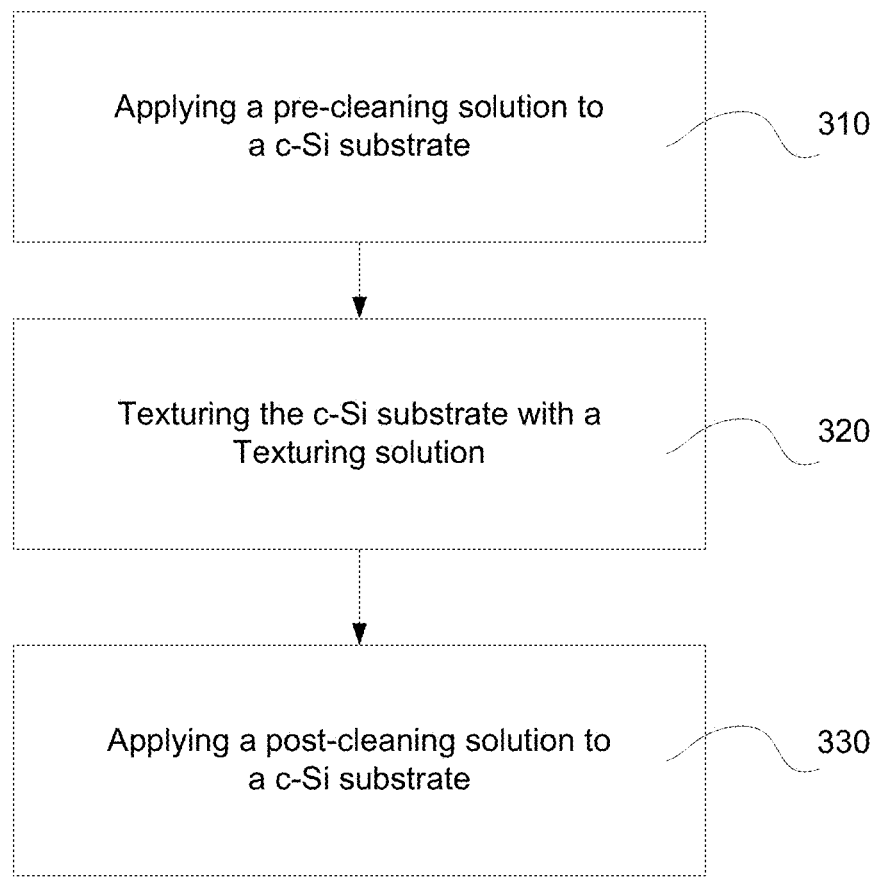
FIG. 3 is a flowchart describing a process for texturing a crystalline silicon substrate.

FIG. 3 shows a flow-chart of various embodiments of texturing a crystalline silicon substrate for use in a crystalline silicon based solar cell. Crystalline silicon based solar cells are much more efficient when the silicon substrate is capable of trapping light because greater conversion of that light to energy can occur. Therefore, it is highly beneficial to texture crystalline silicon substrates as part of the production of solar cells made of the same. In embodiments of the current invention the texturing process may include all or some of the individual processes described in the flowchart of FIG. 3. Additionally, in-line or batch processing may include all or some of the individual processes described in the flowchart of FIG. 3.

In one particular embodiment of the current invention the texturing process may include applying a pre-cleaning solution to a crystalline silicon substrate at block 310 of the flowchart of FIG. 3. The crystalline silicon substrate may be monocrystalline or multicrystalline silicon. The monocrystalline silicon substrate may be in a circular wafer form, such as those used in semiconductor processing. The multicrystalline silicon substrates may be rectangular or square having dimensions of 128 mm×128 mm or 154 mm×154 mm. The thickness of the silicon substrate may also vary. For example, the thickness may be in the range of 100 um and 1000 um and more particularly in the range of 275 um and 775 um. The crystalline silicon substrate may be, but is not limited to, a flat silicon wafer such as an epitaxial thin silicon film, a wire-saw removed silicon wafer, or a rough silicon wafer having wire-saw damage present. In the instance of a crystalline silicon wafer having saw damage the silicon texturing formulation may be formulated to remove the wire-saw damage and to generate surface texture in a single process step.

The pre-cleaning solution may be applied to remove any contaminants from the surface of the substrate that remain after the cutting process or contaminants adhering to the surface during transport and handling of the substrate. The pre-cleaning process may in particular remove organic contaminants that could interfere with the subsequent texturing process. It is hypothesized that organic materials can act as points of nucleation for the texturing process and can potentially interfere with the formation of the intended texture and prevent substrate to substrate texture uniformity. The pre-cleaning solution may be a solvent such as acetone that is good at removing organic contaminants or a commercial cleaning formulation. In one embodiment, the pre-cleaning solution may be acetone and a surfactant. The pre-cleaning may be followed by a distilled water rinse, particularly in an embodiment where a surfactant is used to prevent any surfactant remaining on the surface of the crystalline silicon substrate.

At block 320 of the flowchart of FIG. 3 the c-Si substrate is textured with any embodiments of the silicon texturing formulations described above. In an alternate embodiment, the texturing at block 320 may include more than one texturing bath. For example, a first texturing bath may be used to initiate the texturing process and to ramp up the etching and texturing rate of the crystalline silicon substrate. In some instances, the crystalline silicon substrate may have surface oxidation or wire-saw damage that may require a silicon texturing formulation with greater etching capabilities to initiate the texturing process. Once the texturing process is initiated the crystalline silicon substrate may be textured by a second texturing bath with a different formulation from the first to maintain a stable etch and texture rate. The silicon texturing formulation may be formulated to tune the resulting texture formed on the surface of the crystalline silicon substrate. The parameters that may be tuned to control the texture include pyramid height, surface roughness, kurtosis, pyramid distribution, complete texturizing of the surface (whether there are any flat untextured areas), pyramid uniformity, pyramid angle, and micro-texture. Also, the silicon texturing formulation may be formulated to control the depth of the silicon etched before pyramids are formed on the surface. For example, the depth of the silicon etched before pyramid formation may be in the approximate range of 2-30 um, and more particularly in the approximate range of 5-10 um. The pyramid height (perpendicular from base to peak) may be in the approximate range of 2-10 um, and more particularly in the approximate range of 3-5 um. The ability to tune the depth of the silicon etched before pyramid formation may be advantageous when texturing formulations of the current invention are used to texture thinner substrates.

The silicon texturing formulation may be applied to the crystalline silicon substrate by immersion, spraying, dispense, or curtain dispense. The time that the silicon texturing formulation is applied to the crystalline silicon substrate may be in the approximate range of 3 minutes to 40 minutes, and more particularly in the range of 5 minutes to 15 minutes. The time may be related to the temperature of the silicon texturing formulation because the texturing may be faster at higher temperatures. For example, in a silicon texturing formulation formed of 1.0M KOH, 2-10% by volume DEG and 1.4-2.0% by volume DPGMEA at 90° C. the texturing may be complete in approximately 3-5 minutes. The time and temperature selected may vary depending on the formulation of the silicon texturing formulation and the texture profile that one is trying to achieve.

Figure 4:
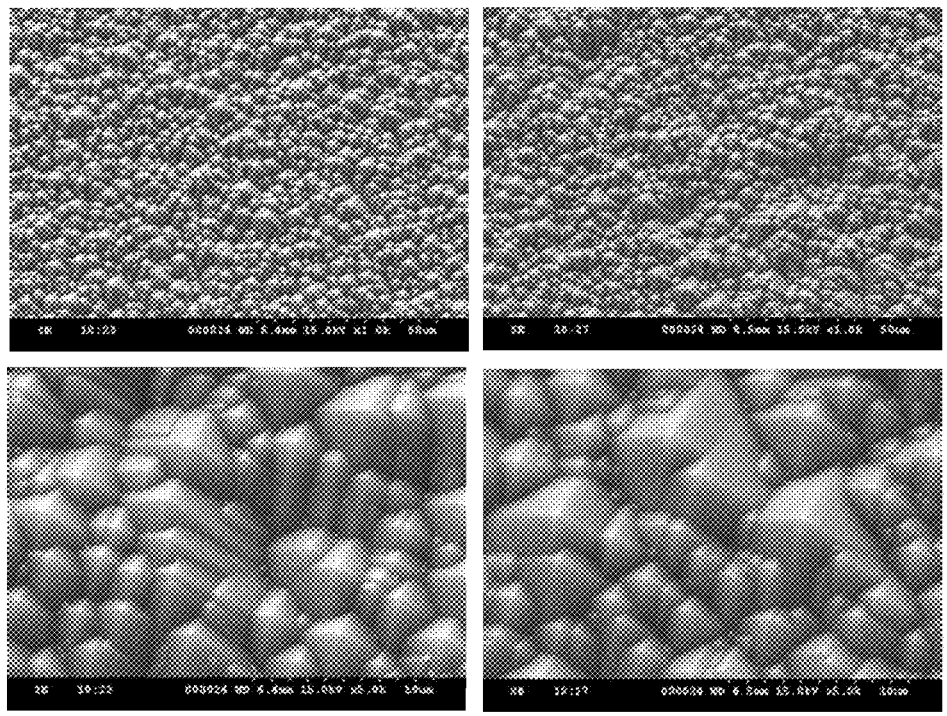
FIG. 4 illustrates SEM photographs of textured crystalline silicon substrates according to various embodiments.

In one embodiment, the silicon texturing formulation may be approximately 1.0M KOH and approximately 2-10% by volume DEG and 1.4-2.0% by volume DPGMEA. The temperature of this solution may be approximately 90° C. A texture having good light trapping characteristics may be produced by this silicon texturing formulation by applying the solution for 3-10 minutes. Examples of the texture formed by this formulation on two different wafers are illustrated in FIG. 4 which are each a SEM (scanning electron microscope) photograph of the textured surface of a monocrystalline silicon substrate.

After texturing, a post-texturing cleaning solution may be applied to the crystalline silicon substrate may at block 330 of the flowchart in FIG. 3 to remove the silicon texturing formulation and any residues from the surface of the substrate. The post-texturing cleaning solution may be a deionized (DI) water rinse or a dilute acid solution. In one embodiment, the silicon texturing formulation described above (1.0M KOH and approximately 2-10% by volume DEG and 1.4-2.0% by volume DPGMEA) may form so little residue that a DI water rinse is all that is needed after texturing to clean the substrate. Alternately, or in addition to the water rinse, a dilute acid solution may be applied to the crystalline silicon substrate to neutralize the alkaline compound in the silicon texturing formulation to stop the texturing of the substrate. The dilute acid solution may be, for example, dilute hydrofluoric (HF) acid. This allows for greater control of the resulting texturing on the crystalline silicon substrate and can increase substrate to substrate uniformity in the texturing. The dilute HF in water solution may have a concentration low enough not to etch the silicon. The dilute HF solution may be applied to the crystalline silicon substrate for a time sufficient to neutralize the alkaline silicon texturing formulation and to stop the texturing.

Solar cells may subsequently be formed from the textured crystalline silicon substrate. The texturing may be optimized to maximize the light trapping capabilities of the solar cells. The silicon texturing formulations described above may be optimized to tune the textured surface to have a predetermined texture profile that can provide maximized light trapping for a solar cell. The optimization of the silicon texturing formulation may be accomplished by a combinatorial workflow developed to screen many silicon texturing formulations having different compositions, temperatures, and application times to a crystalline silicon substrate.

Combinatorial Methodology

Figure 5:
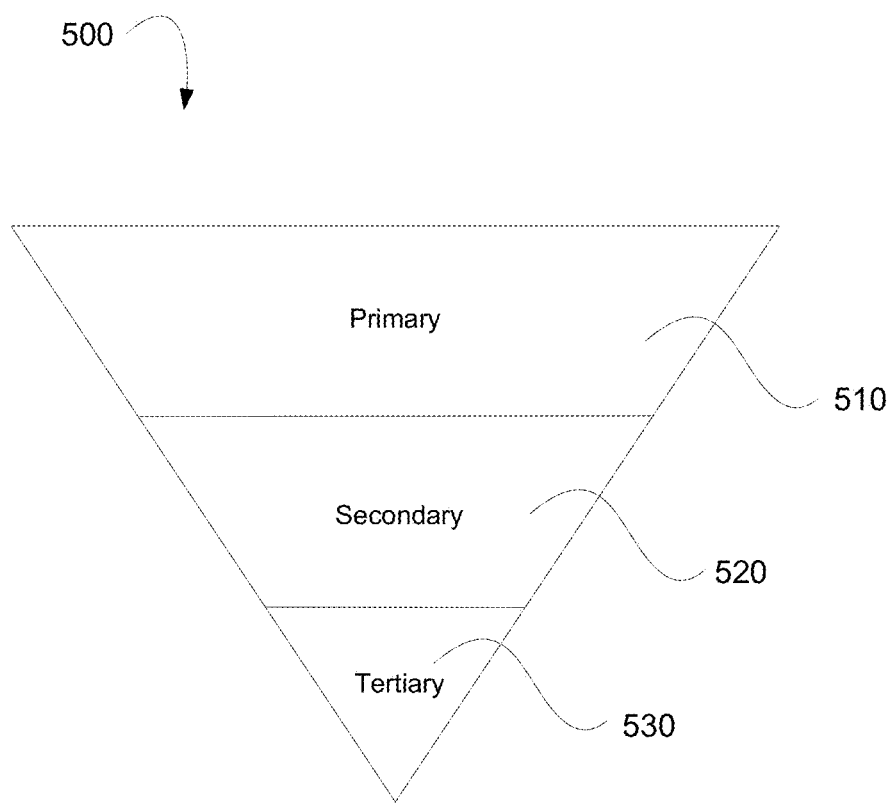
FIG. 5 is a diagram describing an example of a combinatorial funnel for screening samples.

Combinatorial processing may include any processing that varies the processing conditions in two or more regions of a substrate. The combinatorial methodology, in embodiments of the current invention, includes multiple levels of screening to select the silicon texturing formulations for further variation and optimization. In an embodiment, the silicon texturing formulation is optimized to provide the optimal light-trapping texture on the surface of a crystalline silicon substrate. FIG. 5 illustrates a diagram 500 showing three levels of screening for the development of the silicon texturing formulation using combinatorial methodologies. The diagram 500 shows a funnel, where the primary screening 510 includes the largest number of samples of silicon texturing formulations funneling down to the secondary screening 520 and the tertiary screening 530 where the least number of samples of the silicon texturing formulations are tested. The number of samples used at any of the screening levels may be dependent on the substrate or tools used to process the samples.

Figure 6:
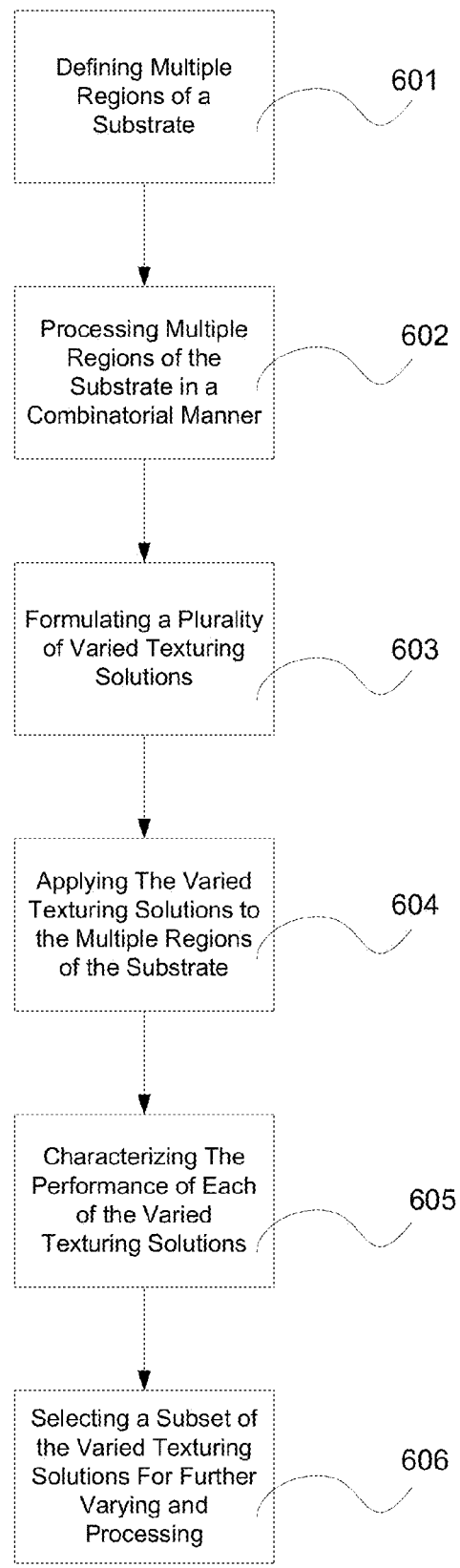
FIG. 6 is a flowchart describing a combinatorial method of tuning a silicon texturing formulation to texture a crystalline silicon substrate to have predetermined characteristics.
Figure 7:
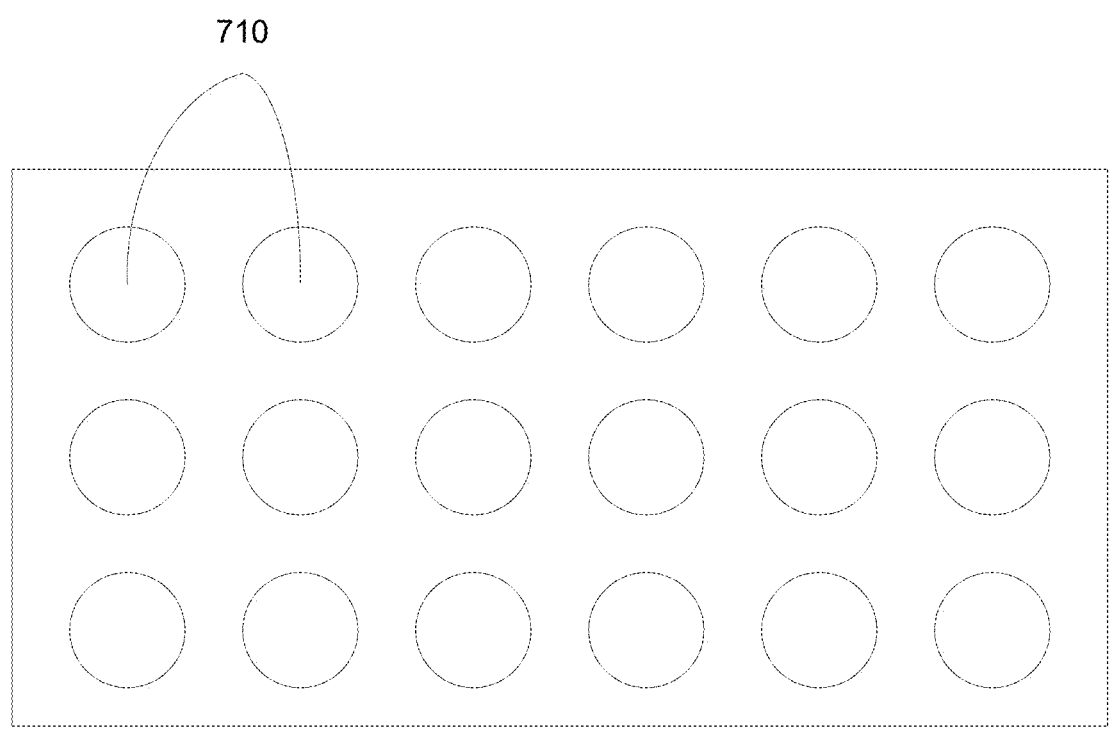
FIG. 7 is an example of a crystalline silicon substrate having defined regions for combinatorial processing.

In an embodiment of the current invention, the screening at the different levels of the funnel is designed to formulate a silicon texturing formulation that is optimized to provide a particular texture profile on the surface of a crystalline silicon substrate. At the primary screening level 510 of this embodiment, the silicon texturing formulation is combinatorially screened in a high throughput manner to determine pyramid size and density, defects, light absorption, and etch rate of silicon by the different silicon texturing formulations. The combinatorial screening process used is as outlined in the flowchart illustrated in FIG. 6. At block 601 of the flowchart of FIG. 6, the method begins by first defining multiple regions 710 of a crystalline silicon substrate 700 as illustrated in FIG. 7. A region of the substrate may be any portion of the substrate that is somehow defined, for example by dividing the substrate into regions having predetermined dimensions or by using physical barriers, such as sleeves, over the substrate. The region may or may not be isolated from other regions. In the embodiment illustrated in FIG. 7, the regions 710 may be defined by multiple sleeves that are in contact with the surface of the crystalline silicon substrate 700. The number of regions 710 defined by sleeves is only limited by the tools used for the combinatorial processing. As such, multiple experiments may be performed on the same substrate, and any number of regions may be defined. For example, five silicon texturing formulations may be tested using fifteen regions of a substrate, each cleaning solution being tested three times.

In this embodiment, the substrate 700 may be a multi-crystalline or monocrystalline silicon substrate where each of the multiple regions 710 is textured using varied silicon texturing formulations. At block 602 of the flowchart in FIG. 6, the multiple regions 710 of the substrate 700 are processed in a combinatorial manner. In an embodiment, this is done by formulating a plurality of varied silicon texturing formulations. In one embodiment, this involves formulating multiple silicon texturing formulations having methodically varied components (such as the alkaline compound or the high boiling point alcohol additive) by varying at least one of the chemical components of the silicon texturing formulation. The varied chemical component may also have varied concentrations. At block 604, the varied silicon texturing formulations are applied to the multiple regions 710 of the substrate 700. A single varied silicon texturing formulation is applied to each of the multiple regions 710 for a predetermined amount of time.

At block 605, the performance of each of the varied silicon texturing formulations is characterized. The characterization is performed to determine how effectively each of the varied silicon texturing formulations textures the crystalline silicon substrate at each of the regions 710. The characterization may first be performed by a visual analysis of the textured regions with a scanning electron microscope (SEM). The optical microscopy images will provide the information about the pyramid density, whether texturing has occurred, whether the texturing covers all of the surface or whether there are flat areas between the texturing. The size of the pyramids may also be determined through the visual analysis. For each region, multiple images may be taken to determine whether the texturing is uniform across the region. The reflectance of the textured surface of each of the regions is then measured using a UV-Vis spectrometer (a spectrometer measuring light reflectance from the ultraviolet (UV) range to the visible range of the spectrum.) From this reflectance data it can be determined how well the texture traps, or absorbs, light. The lower the reflectance, the more absorption. From these images in combination with the UV-Vis spectrometer data it can be determined whether the texturing is sufficient to proceed to the next combinatorial screening step, which may also be part of the primary screening or may be secondary screening.

In some embodiments, the etch rate of the silicon texturing formulation is determined by how much of the surface of the silicon substrate is etched before texturing occurs. The amount of silicon etched before texturing occurs may be determined by using a profilometer to compare the height of the un-etched areas between the test regions to the depth etched within the test regions. In this example, if a silicon texturing formulation removes too much of the surface before texturing occurs, then it is screened out of consideration.

The screening then includes a second characterization of the regions 710 where the texturing appeared to be uniform across the substrate based on the SEM images and the UV-Vis spectrometer data. The regions 710 where the texture appeared to be uniform are then characterized by AFM measurements to evaluate the roughness, skewness, and kurtosis of the substrate. The AFM measurements have a resolution on the order of micrometers and may provide more detailed information on the texture on a finer scale. The AFM measurements provide the root means square (rms) average of the roughness of a region of the substrate to provide a measure of the roughness of the surface in nanometers. Using the AFM information, a subset of the varied silicon texturing formulations is then selected for further varying and processing at block 606 of the flowchart in FIG. 6. A subset of silicon texturing formulations is selected based on which silicon texturing formulations have the highest roughness values because higher roughness indicates higher randomness in the pyramid size and randomness in the pyramid distribution, both of which provide the best light trapping.

The combinatorial methodology then funnels down to the secondary screening 520 of FIG. 5. The subset of selected silicon texturing formulations from the primary screening 510 is then tested on another crystalline silicon substrate. The secondary screening uses the same methodology as the primary screening, as outlined in the flowchart of FIG. 6. After defining the multiple regions on the crystalline silicon substrate, using similar methods as described above with relation to FIG. 7, the multiple regions are processed in a combinatorial manner at block 602. The processing in a combinatorial manner is performed by formulating a plurality of varied silicon texturing formulations at block 603 based on the subset of silicon texturing formulations selected at the end of the primary screening process. In an embodiment, the subset of silicon texturing formulations is varied to test the process space of the chemical compositions that were identified as having the best texturing in the primary screening. For example, the temperature and time of the compositions may be varied. At block 604 these selected silicon texturing formulations are applied to the multiple regions of the crystalline silicon substrate to determine the process space for each composition.

The performance of each of the silicon texturing formulations applied to the multiple regions of the substrate is then characterized at block 605. The characterization is done through the same process as described above in relation to the primary screening. In an embodiment, the textured crystalline silicon surfaces may first be visually analyzed using SEM photographs to eliminate any of the silicon texturing formulations that did not uniformly texture pyramids (no flat areas), did not produce pyramids within the range of predetermined sizes, or produced visible defects. Optical measurements with the UV-Vis spectrometer may then be made to determine whether the reflectance is within a predetermined range. Profilometer measurements may also be made to determine whether the etching of the silicon is minimal and less than a predetermined amount. At block 406 a subset of the varied silicon texturing formulations is selected for further varying and processing based on the characterization data. AFM measurements are then taken of the silicon texturing formulations that meet the predetermined characteristics measured visually by SEM, optically by UV-vis spectrometry, and by the profilometer. A subset of the silicon texturing formulations for which it was found that the roughness of the texture was within a predetermined range based on the AFM measurements may undergo further primary and secondary screening to narrow down the results for tertiary screening 530 or the subset may directly go to tertiary screening 530.

The tertiary screening level 530 of the combinatorial funnel will perform the final screening of the silicon texturing formulations where the textured crystalline silicon substrates are used to build solar cells. In an embodiment, the number of silicon texturing formulations at this screening level may be less than ten, in one particular embodiment the number of silicon texturing formulations may be one or two, but could be any number. The final screening will optimize the silicon texturing formulation to texture a crystalline silicon substrate that is used to build a solar cell. Electrical data from these solar cells can be analyzed in the characterization of the performance of the silicon texturing formulations at the tertiary screening level to identify which texturing formulations provide the electrical results within a predetermined range. The texturing formulations identified in the tertiary screening level may then be scaled up to be used in the manufacturing of commercial-grade solar cells.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A texturing formulation consisting essentially of:
   water;
   at least one aliphatic diol;
   an alkaline compound; and
   a derivative compound of ethylene glycol or propylene glycol.

2. The formulation of claim 1, wherein the aliphatic diol comprises at least one of butanediol, pentanediol, hexanediol, heptanediol, octanediol, or a combination thereof.

3. The formulation of claim 1, wherein the aliphatic diol comprises greater than 4 carbon atoms and less than or equal to 10 carbon atoms.

4. The formulation of claim 3, wherein the aliphatic diol comprises at least one of 3-methyl-1,5-pentanediol, 2-methyl-2,4-pentanediol, 2,2,4-trimethyl-1,3-pentanediol, 1,4-butanediol-diglycidil ether, 1,4-butanediol vinyl ether, 1,4-butanediol divinyl ether, 1,4-butanediol dimethylcrylate, 2-ethyl-1,3-hexanediol, 2,5-dimethyl-2,5-hexanediol, or a combination thereof.

5. The formulation of claim 1, wherein the alkaline compound comprises at least one of KOH, NaOH, TMAH, RbOH, CsOH, $NH_3OH$, or a combination thereof.

6. The formulation of claim 5, wherein the alkaline compound comprises KOH.

7. The formulation of claim 1, wherein the derivative compound of ethylene glycol or propylene glycol comprises DEGBE, DEGME, DEGDME, DEGEE, DEGPE, DPGME, DPGPE, DPGDME, DPGMEA, PGMEA, DEGMEA, DEGEEA, DEGPEA, or a combination thereof.

8. The formulation of claim 7, wherein the derivative compound of ethylene glycol or propylene glycol comprises DEGBE.

9. The formulation of claim 7, wherein the second derivative compound of the alkylene glycol comprises DEGPEA.

10. The formulation of claim 7, wherein the second derivative compound of the alkylene glycol comprises DEGEEA.

11. A texturing formulation consisting essentially of:
    water;
    at least one aliphatic diol;
    an alkaline compound;
    a derivative compound of ethylene glycol or propylene glycol; and
    dissolved silicon.

12. The formulation of claim 11, wherein the aliphatic diol comprises at least one of butanediol, pentanediol, hexanediol, heptanediol, octanediol, or a combination thereof.

13. The formulation of claim 11, wherein the aliphatic diol comprises greater than 4 carbon atoms and less than or equal to 10 carbon atoms.

14. The formulation of claim 13, wherein the aliphatic diol comprises at least one of 3-methyl-1,5-pentanediol, 2-methyl-2,4-pentanediol, 2,2,4-trimethyl-1,3-pentanediol, 1,4-butanediol-diglycidil ether, 1,4-butanediol vinyl ether, 1,4-butanediol divinyl ether, 1,4-butanediol dimethylcrylate, 2-ethyl-1,3-hexanediol, 2,5-dimethyl-2,5-hexanediol, or a combination thereof.

15. The formulation of claim 14, wherein the alkaline compound comprises at least one of KOH, NaOH, TMAH, RbOH, CsOH, $NH_3OH$, or a combination thereof.

16. The formulation of claim 15, wherein the alkaline compound comprises KOH.

17. The formulation of claim 16, wherein the derivative compound of ethylene glycol or propylene glycol comprises DEGBE, DEGME, DEGDME, DEGEE, DEGPE, DPGME, DPGPE, DPGDME, DPGMEA, PGMEA, DEGMEA, DEGEEA, DEGPEA, or a combination thereof.

18. The formulation of claim 11, wherein the dissolved silicon comprises a Si powder, Si pieces, silica particles, silica gels, silica powders, TEOS or a combination thereof.

19. The formulation of claim 11, wherein the at least one aliphatic diol comprises 3-methyl-1,5-pentanediol and the alkaline compound comprises KOH, and the derivative compound of ethylene glycol or propylene glycol comprises diethylene glycol.

20. The formulation of claim 19, wherein a concentration of the 3-methyl-1,5-pentanediol is between 20 g/L and 30 g/L, a concentration of the KOH is between 20 g/L and 60 g/L, a concentration of the diethylene glycol is between 20 g/L and 80 g/L, and a concentration of the dissolved silicon is between 0 g/L and 2 g/L.

* * * * *